United States Patent [19]

Vongfuangfoo et al.

[11] Patent Number: 5,465,470
[45] Date of Patent: Nov. 14, 1995

[54] FIXTURE FOR ATTACHING MULTIPLE LIDS TO MULTI-CHIP MODULE (MCM) INTEGRATED CIRCUIT

[75] Inventors: Sutee Vongfuangfoo, Sunnyvale; Robert Trabucco, Los Altos, both of Calif.

[73] Assignee: LSI Logic Corporation, Milpitas, Calif.

[21] Appl. No.: 299,209

[22] Filed: Aug. 31, 1994

[51] Int. Cl.⁶ .................................................. B25B 27/02
[52] U.S. Cl. .............................. 29/559; 156/300; 156/579; 29/281.5; 269/6; 269/238; 269/903
[58] Field of Search .................................. 156/299, 579, 156/580, 581, 300; 29/281.1, 760, 281.5, 559; 269/6, 238, 903; 361/736, 752

[56] References Cited

U.S. PATENT DOCUMENTS

| 4,767,984 | 8/1988 | Bakker ..................................... | 269/903 |
| 5,074,036 | 12/1991 | Dunaway et al. ....................... | 156/299 |
| 5,106,451 | 4/1992 | Kan et al. ................................ | 156/580 |
| 5,332,463 | 7/1994 | Eberlein et al. ........................ | 269/903 |

*Primary Examiner*—Michael W. Ball
*Assistant Examiner*—Sam Chuan Yao
*Attorney, Agent, or Firm*—Poms, Smith, Lande & Rose

[57] ABSTRACT

A fixture clamps a plurality of lids onto a multi-chip module (MCM) integrated circuit for adhesively attaching the lids to cover a plurality of cavities in the module in which chips or dies are mounted. The fixture includes a base plate which is formed with recesses in which the lids and the module are fittingly retained with the lids properly positioned relative to the module. A pressure plate is guided onto the module by a pin assembly and presses the module against the base plate. A plurality of spring loaded clamps have first jaws that engage with the lids through respective holes in the base plate and second jaws that engage with the pressure plate. The clamp thereby clamps the lids and the pressure plate to the module. The assembly including the module, lids, pressure plate and clamps is then removed from the base plate to enable curing of an adhesive that bonds the lids to the module, and frees the base plate for reuse.

22 Claims, 4 Drawing Sheets

FIXTURE FOR ATTACHING MULTIPLE LIDS TO MULTI-CHIP MODULE (MCM) INTEGRATED CIRCUIT

BACKGROUND OF THE INVENTION

1. Field of the Invention

The present invention generally relates to the art of microelectronic integrated circuit fabrication, and more specifically to a fixture for attaching multiple lids to a multi-chip module (MCM) integrated circuit.

2. Description of the Related Art

A Multi-Chip Module (MCM), also known as a hybrid integrated circuit, includes a substrate structure on which one or more integrated microcircuit dies are mounted. The substrate structure has a multilevel architecture including alternating patterned metal conductor and dielectric layers.

The conductors layers are formed by thin film screen printing, sputtering or plating, and are patterned as lines and planes to provide power and signal interconnections between chips. Vertical interconnects (vias) are formed through the dielectric layers to appropriately interconnect adjacent conductor layers.

In order to physically and environmentally seal the dies and associated interconnections and thereby increase the durability and reliability of the MCM, the substrate structure can be formed with cavities in which the dies are mounted. After the mounting and interconnection processes have been completed, the cavities are covered with lids that are made of a ceramic material and adhered to the substrate structure using, for example, an epoxy adhesive.

The lids must be attached to the substrate structure in the proper relative positions in order to ensure that the cavities will be sealingly covered. It is possible to apply adhesive to the edge portions of the lids, and attach the lids to the substrate structure manually. However, a significant length of time is required for the adhesive to cure, and the lids can be moved out of position during subsequent handling of the MCM. If this occurs, it would be necessary to remove and subsequently attach new lids, with the accompanying danger of damaging the substrate structure.

For this reason, simple spring-loaded clamps that resemble clothespins have been used to clamp the lids to the substrate structure during the time the adhesive requires for curing. However, it is difficult in practice to accurately attach the lids to the substrate structure and then apply the clamps without moving the lids. The clamps themselves can be easily displaced, which in turn cause the lids to move out of their proper positions.

SUMMARY OF THE INVENTION

It is an object of the present invention to provide a fixture for accurately and securely clamping a plurality of lids onto a multi-chip module (MCM) integrated circuit for adhesively attaching the lids to cover a plurality of cavities in the module in which chips or dies are mounted.

It is another object of the invention to provide a method of using the fixture to apply lids to a multi-chip module (MCM) integrated circuit.

The present fixture includes a base plate which is formed with recesses in which the lids and the module are fittingly retained with the lids properly positioned relative to the module. A pressure plate is guided onto the module by a pin assembly and presses the module against the base plate.

A plurality of spring loaded clamps have first jaws that engage with the lids through respective holes in the base plate and second jaws that engage with the pressure plate. The clamp thereby clamps the lids and the pressure plate to the module.

The assembly including the module, lids, pressure plate and clamps is then removed from the base plate to enable curing of an adhesive that bonds the lids to the module, and frees the base plate for reuse.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
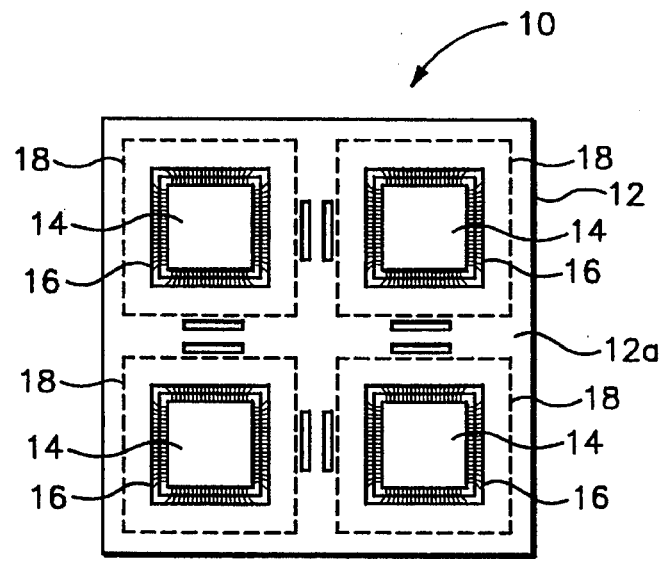
FIG. 1 is a plan view illustrating a Multi-Chip Module (MCM) integrated circuit and positions at which lids are attached using a fixture and method according to the present invention.

FIG. 1 illustrates a Multi-Chip Module (MCM) integrated circuit 10 to which the present invention relates. The circuit 10 comprises a substrate structure 12 on which one or more integrated microcircuit dies 14 are mounted.

Although not illustrated in detail, the substrate structure 12 has a multilevel architecture including alternating patterned metal conductor and dielectric layers. The conductors layers are formed by thin film screen printing, sputtering or plating, and are patterned as lines and planes to provide power and signal interconnections between chips. Vertical interconnects (vias) are formed through the dielectric layers to appropriately interconnect adjacent conductor layers.

In order to physically and environmentally seal the dies 14 and associated interconnections and thereby increase the durability and reliability of the circuit 10, the substrate structure 12 is formed with cavities 16 in which the dies 14 are mounted respectively.

Ceramic lids 18 as indicated in broken line in FIG. 1 are adhered to a first surface 12a of the substrate structure 12 in which the cavities 16 are formed in order to hermetically cover and seal the cavities 16. Typically, an adhesive such as epoxy is applied to the edge portions of the lids 18 to adhere the lids 18 to the surface 12a.

Figure 2:
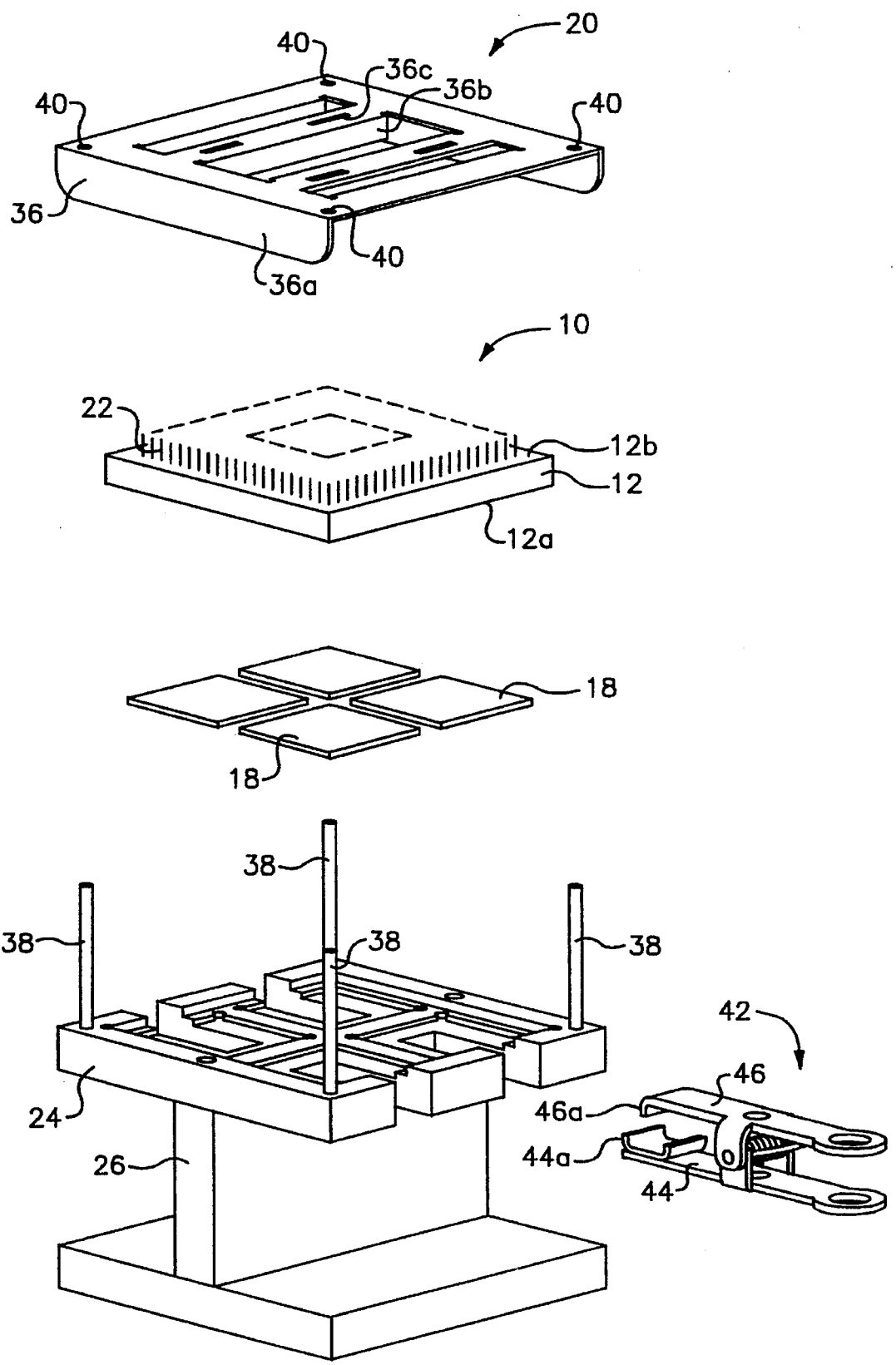
FIG. 2 is an exploded view illustrating the present fixture.

The problems discussed above regarding positioning the lids 18 on the substrate structure 12 over the cavities 16 and maintaining the lids 18 in position for the length of time required for curing of the adhesive are solved in accordance with the present invention by a fixture 20 illustrated in FIG. 2. The substrate structure 12 is further illustrated in FIG. 2 relative to the fixture 20, and has a second surface 12*b* which is opposite to the first surface 12*a*. A plurality of pins 22 for plugging the circuit 10 into a conjugate integrated circuit socket (not shown) extend perpendicularly from the second surface 12*b*.

Figure 5:
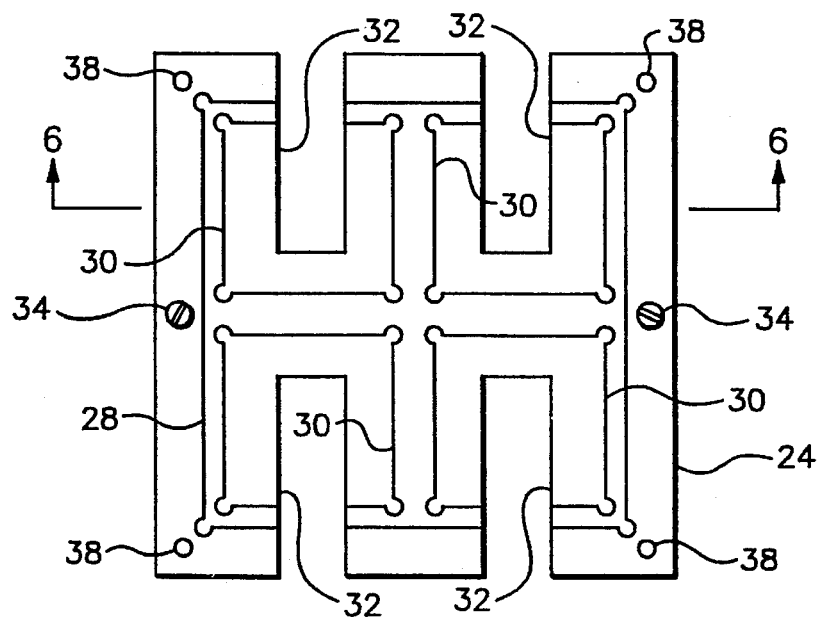
FIG. 5 is a plan view illustrating a base plate of the present fixture.

The fixture 20 comprises a base plate 24 that is preferably supported by a pedestal 26. As best seen in FIG. 5, the upper surface of the base plate 24 is formed with a large first recess 28 that is conjugate to the substrate structure 12. More specifically, the cross section of the recess 28 is substantially identical to that of the substrate structure 12 such that the structure 12 can be placed into and fittingly retained in the recess 28.

The upper surface of the base plate 24 is further formed with a plurality of smaller second recesses 30 that are similarly conjugate to the lids 18. In the exemplary embodiment of the invention as illustrated in the drawings, the substrate structure 12 is formed with four cavities 16, and four lids 18 are provided for covering and sealing the cavities 16 respectively. The base plate 24 is therefore formed with four recesses 30, each having a cross section that is substantially identical to that of the lids 18 such that the lids 18 can be placed into and fittingly retained in the respective recesses 30.

Figure 6:
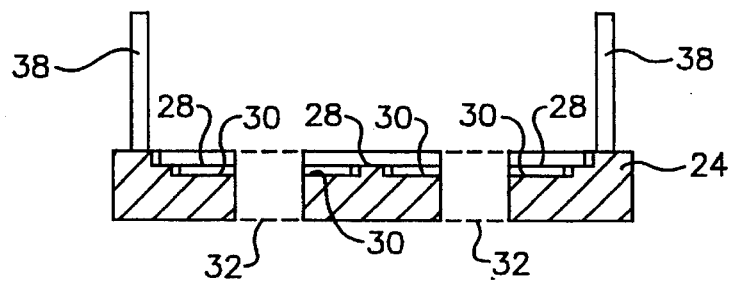
FIG. 6 is a section of the base plate taken on a line 6—6 of FIG. 5.
Figure 7:
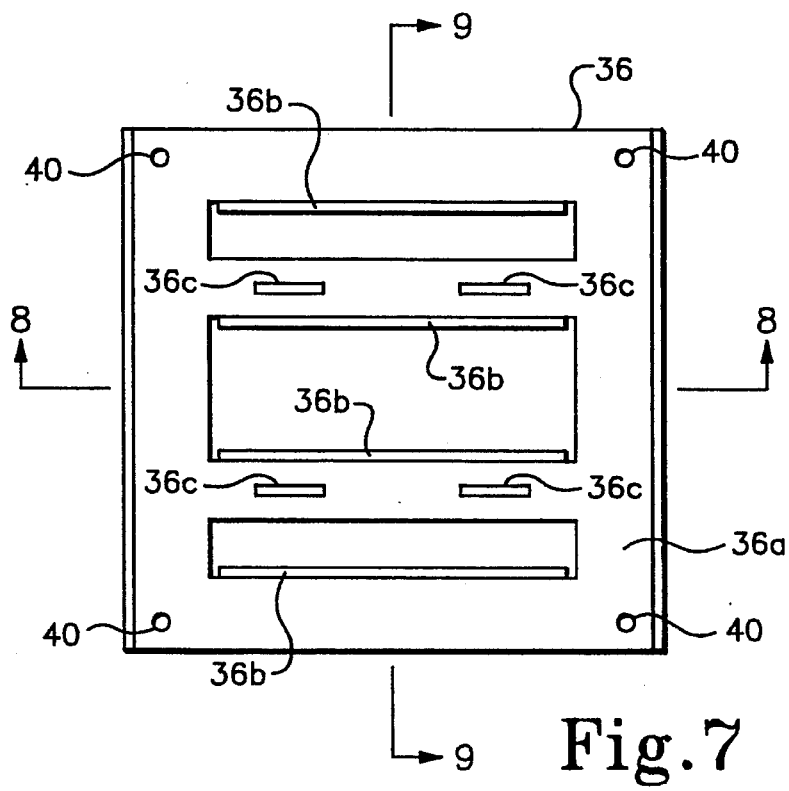
FIG. 7 is a plan view illustrating a pressure plate of the present fixture.
Figure 8:
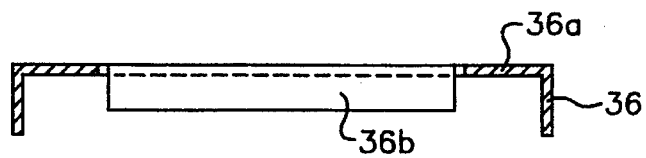
FIG. 8 is a section of the pressure plate taken on a line 8—8 of FIG. 7.
Figure 9:
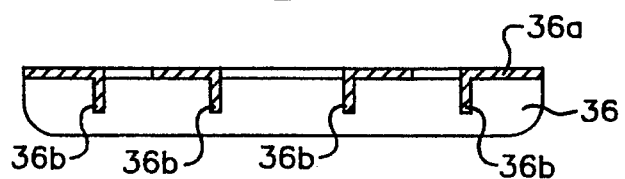
FIG. 9 is a section of the pressure plate taken on a line 9—9 of FIG. 7.

The base plate 24 is further formed with four holes that are configured as elongated slots 32 which open through the base plate 24 into the recesses 30 respectively. The recesses 28 and 30 and the slots 32 are also illustrated in sectional view in FIG. 6. Further illustrated in FIG. 5 are screws 34 for attaching the base plate 24 to the pedestal 26.

The fixture 20 further includes a pressure plate 36 that is illustrated in FIGS. 2 and 7 to 9. The pressure plate 36 can also be referred to as a clamp plate or a guide plate. The pressure plate 36 comprises a base 36*a*, and a plurality of elongated projections or tabs 36*b* that extend away from the base 36*a* toward the base plate 24 as viewed in FIG. 2.

Means are preferably provided for guiding the pressure plate 36 toward and away from the base plate 24 while maintaining the plates 24 and 36 parallel to each other. A preferred guide means according to the invention includes a plurality of elongated rods or pins 38 that extend perpendicularly away from the base plate 24 as viewed in FIG. 2. The pressure plate 36 is formed with holes 40. The pins 38 fittingly extend through the holes 40, thereby providing the function of precisely guiding the pressure plate 36 for perpendicular movement relative to the base plate 24.

The tabs 36*b* are configured to extend between the pins 22, and thereby prevent the pins 22 from engaging with the base 36*a* of the pressure plate 36. This positively prevents the pins 22 from being damaged by the fixture 20.

The fixture 20 further comprises a plurality, in this case four, of spring loaded clamps 42. One clamp 42 is provided for each lid 18, although the invention is not so limited. Each clamp 42 includes a first jaw 44 having a shape conjugate to the elongated slots 32 in the base plate 24, and a second jaw 46 having an elongated projection 46*a* that fits in a corresponding hole 36*c* in the pressure plate 36. The jaws 44 are preferably provided with U-shaped channels 44*a* having ends that engage with the respective lids 18 and advantageously distribute the force applied thereto.

A method of utilizing the fixture 20 in accordance with the present invention will be described with reference to FIGS. 2, 3 and 4.

In the first step of the method, an epoxy or other suitable adhesive is applied to the edge portions of the lids 18, and the lids 18 are placed into the recesses 30 in the base plate 24 with the adhesive facing upward. Then, the substrate structure 12 is placed into the recess 28 in the base plate 24, with the first surface 12*a* facing downward and engaging with the base plate 24. In this manner, the lids 18 are fittingly retained in the recesses 30, and the substrate structure 12 is fittingly retained in the recess 28.

Then, the pressure plate 36 is lowered onto the substrate structure 12, with the guide means including the pins 38 and holes 40 maintaining the pressure plate 36 parallel to the base plate 24. The elongated tabs 36*b* of the pressure plate 36 engage the second surface 12*b* of the substrate structure 12, thereby pressing the substrate structure 12 against the base plate 24.

Next, the clamps 42 are attached to clamp the lids 18 and the pressure plate 36 against the substrate structure 12. More specifically, the first jaws 44 of the clamps 42 are inserted into the elongated slots 32 of the base plate 24. The U-shaped channels 44*a* of the jaws 44 engage the centers of the lids 18, and press the lids 18 against the first surface 12*a* of the substrate structure 12 with the adhesive interposed therebetween. The elongated projections 46*a* of the second jaws 46 of the clamps 42 engage in the elongated slots 36*c* of the pressure plate 36, and thereby press the elongated tabs 36*b* of the pressure plate 36 against the second surface 12*b* of the substrate structure 12.

The assembly comprising the substrate structure 12, lids 18, pressure plate 36 and clamps 42 can then be removed from the base plate 24. This enables the base plate 24 to be used for attaching lids 18 to other substrate structures 12.

Figure 3:
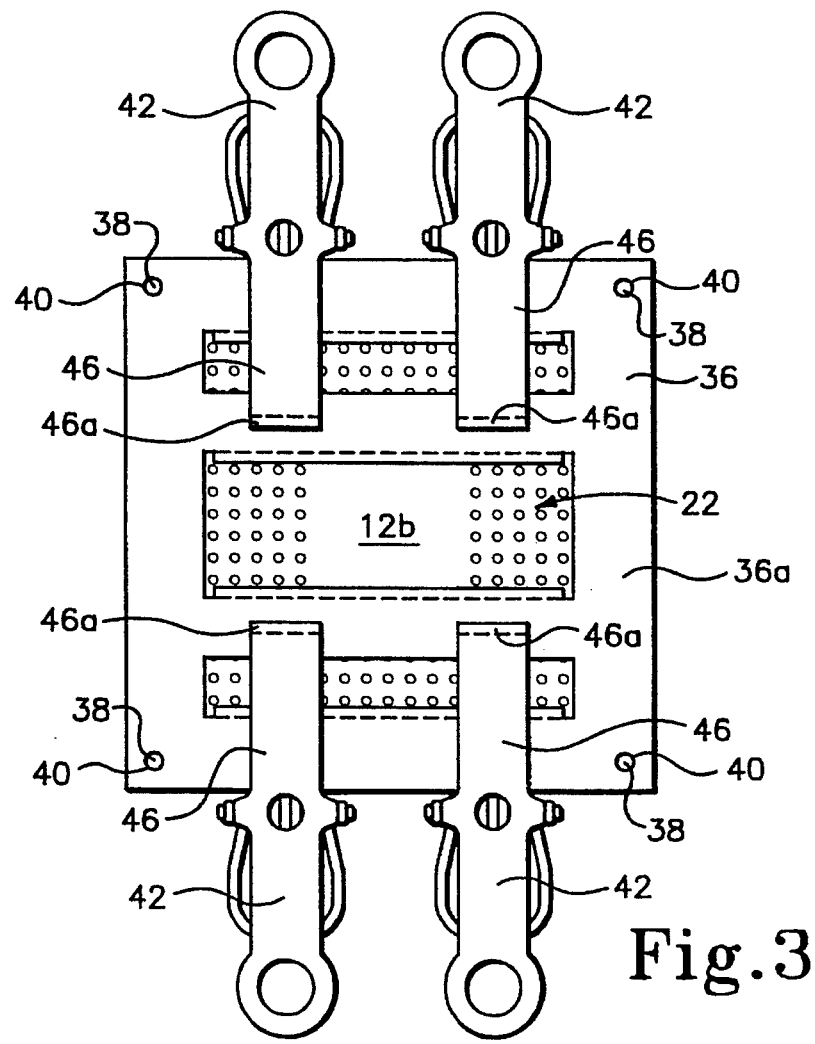
FIG. 3 is a plan view illustrating an assembly including an MCM with attached lids, a pressure plate and a plurality of clamps as viewed from above.
Figure 4:
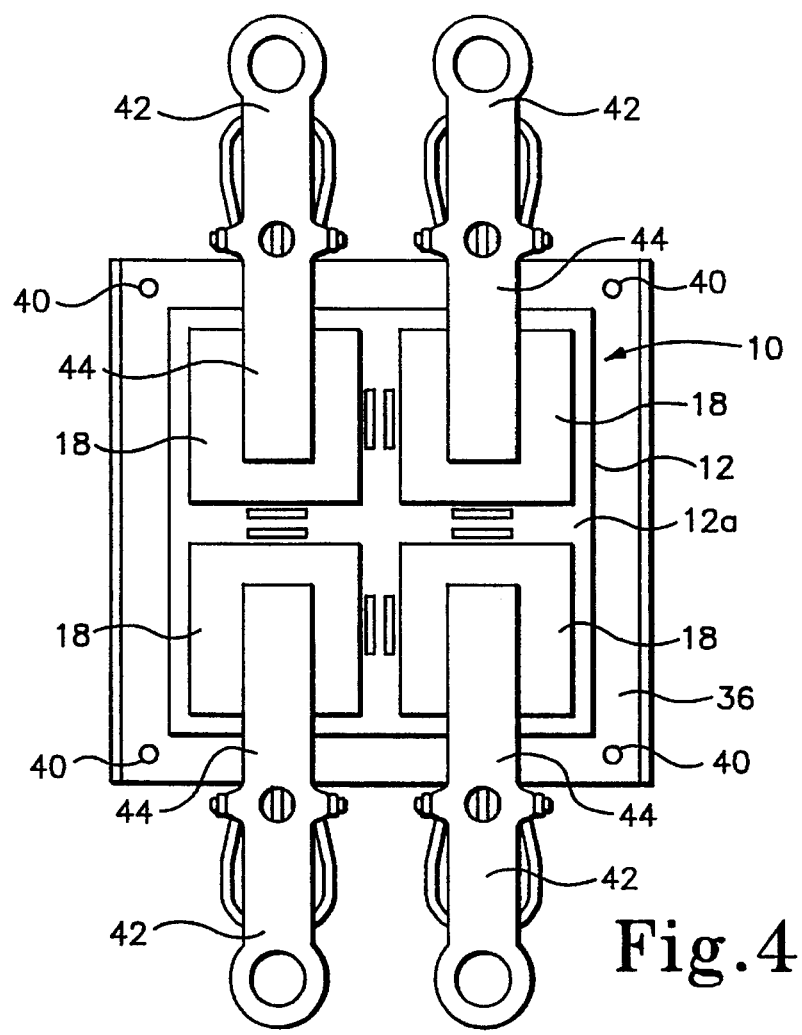
FIG. 4 is similar to FIG. 3, but illustrates the assembly as viewed from below.

The assembly as removed from the base plate 24 is illustrated from the top in FIG. 3, and from the bottom in FIG. 4. It will be seen that the first jaws 44 of the clamps 42 securely clamp the lids 18 against the first surface 12*a* of the substrate structure 12.

The elongated projections 46*a* of the clamps 42 are fittingly engaged in the elongated holes 36*c* of the pressure plate 36, and the clamps 42 are thereby prevented from lateral movement relative to the pressure plate 36. In this manner, the assembly as illustrated in FIGS. 3 and 4 can be transported to another location to enable curing of the adhesive to seal the lids 18 to the substrate structure 12, without the danger of the clamps 42 and the lids 18 being displaced by handling.

The engagement of the first jaws 44 in the slots 32 of the base plate 24, in combination with the engagement of the tabs 46*a* and the holes 36*c* as described above, ensure that the clamps 42 will be positioned accurately with respect to the lids 18. The first jaws 44 further prevent rotation of the clamps 42 relative to the base plate 24, and lateral relative movement of the clamps 42 perpendicular to the slots 32.

In summary, the present invention provides a fixture and a method for using the fixture that accurately and securely clamps a plurality of lids onto a multi-chip module (MCM) integrated circuit for adhesively attaching the lids to cover a plurality of cavities in the module in which chips or dies are mounted.

Various modifications will become possible for those skilled in the art after receiving the teachings of the present disclosure without departing from the scope thereof.

For example, although the present invention has been illustrated and described as being applied to a multi-cavity MCM, it can also be used to apply a single lid to an integrated circuit substrate structure including a single cavity.

We claim:

1. A fixture for clamping a lid onto a first surface of an integrated circuit substrate structure in a predetermined relative position such that said lid covers a cavity formed in said first surface, comprising:

a base plate having a first recess conjugate to said substrate structure, a second recess conjugate to said lid with said lid in said predetermined relative position, and a hole opening through the base plate into said second recess;

a pressure plate for pressing against a second surface of said substrate structure which is opposite to said first surface and thereby pressing said first surface against the base plate with said substrate structure fittingly retained in said first recess and said lid fittingly retained in said second recess; and a clamp for engaging with the pressure plate and with said lid through said hole for clamping said lid onto said first surface and clamping the pressure plate against said second surface.

2. A fixture as in claim 1, further comprising a guide assembly for guiding the pressure plate toward and away from the base plate in parallel relation therewith.

3. A fixture as in claim 2, in which the guide assembly comprises:

a plurality of rods extending perpendicularly from the base plate toward the pressure plate; and a plurality of holes formed in the pressure plate through which said rods fittingly extend.

4. A fixture as in claim 1, in which the clamp comprises:

a first jaw that extends through said hole and engages with said lid; and a second jaw that engages with the pressure plate.

5. A fixture as in claim 4, in which:

said hole is shaped as an elongated slot; and the first jaw is shaped to fittingly engage in said elongated slot for preventing relative rotational movement between the clamp and the base plate and for preventing relative lateral movement between the clamp and the base plate perpendicular to said elongated slot.

6. A fixture as in claim 5, in which:

the pressure plate is formed with an elongated hole that extends perpendicular to said elongated slot; and the second jaw is formed with an elongated projection that fittingly engages in said elongated hole for preventing relative lateral movement between the clamp and the pressure plate parallel to said elongated slot.

7. A fixture as in claim 4, in which:

the pressure plate is formed with a hole; and the second jaw is formed with a projection that fits into said hole of the pressure plate for preventing relative lateral movement between the clamp and the pressure plate.

8. A fixture as in claim 1, in which:

said substrate structure comprises a plurality of pins that extend from said second surface; and the pressure plate comprises:

a base with which the clamp engages; and a spacer assembly for preventing said pins from engaging with the base.

9. A fixture as in claim 8, in which the spacer assembly comprises a plurality of projections that extend from the base between said pins into engagement with said second surface.

10. A fixture as in claim 9, in which said projections comprise elongated tabs.

11. A method of clamping a lid onto a first surface of an integrated circuit substrate structure in a predetermined relative position such that said lid covers a cavity formed in said first surface, comprising the steps of:

(a) providing a base plate having a first recess conjugate to said substrate structure, a second recess conjugate to said lid with said lid in said predetermined relative position, and a hole opening through the base plate into said second recess;

(b) inserting said lid into said second recess;

(c) inserting said substrate structure into said first recess with said first surface engaging said base plate;

(d) pressing a pressure plate against a second surface of said substrate structure that is opposite to said first surface; and (e) attaching a clamp that engages with the pressure plate and with said lid through said hole for clamping said lid onto said first surface and clamping the pressure plate against said second surface.

12. A method as in claim 11, further comprising the step, performed after step (e), of:

(f) integrally removing said substrate structure, said lid, the pressure plate and the clamp from the base plate.

13. A fixture for clamping a plurality of lids onto a first surface of an integrated circuit substrate structure in predetermined relative positions such that said lids cover cavities formed in said first surface respectively, comprising:

a base plate having a first recess conjugate to said substrate structure, a plurality of second recesses conjugate to said lids with said lids in said predetermined relative positions, and a plurality of holes opening through the base plate into said second recesses respectively;

a pressure plate for pressing against a second surface of said substrate structure that is opposite to said first surface and thereby pressing said first surface against the base plate with said substrate structure fittingly retained in said first recess and said lids fittingly retained in said second recesses respectively; and a plurality of clamps for engaging with the pressure plate and with said lids through said holes for clamping said lids onto said first surface respectively and clamping the pressure plate against said second surface.

14. A fixture as in claim 13, further comprising a guide assembly for guiding the pressure plate toward and away from the base plate in parallel relation therewith.

15. A fixture as in claim 14, in which the guide assembly comprises:

a plurality of rods extending perpendicularly from the base plate toward the pressure plate; and a plurality of holes formed in the pressure plate through which said rods fittingly extend.

16. A fixture as in claim 13, in which each clamp comprises:

a first jaw that engages with said lid respectively; and a second jaw that engages with the pressure plate.

17. A fixture as in claim 16, in which:

each hole is shaped as an elongated slot; and each first jaw is shaped to fittingly engage in said elongated slot for preventing relative rotational movement between the clamp and the base plate and for preventing relative lateral movement between the clamp and the base plate perpendicular to said elongated slot respectively.

18. A fixture as in claim 17, in which:

the pressure plate is formed with a plurality of elongated holes that extend perpendicular to said elongated slots respectively; and each second jaw is formed with an elongated projection that fittingly engages in said elongated hole for preventing relative lateral movement between the clamp and the pressure plate parallel to said elongated slot respectively.

19. A fixture as in claim 16, in which:

the pressure plate is formed with a plurality of holes; and each second jaw is formed with a projection that fits into one of said holes of the pressure plate for preventing relative lateral movement between the clamp and the pressure plate respectively.

20. A fixture as in claim 13, in which:

said substrate structure comprises a plurality of pins that extend from said second surface; and the pressure plate comprises a base with which the clamps engage, and a spacer assembly for preventing said pins from engaging with the base.

21. A fixture as in claim 20, in which the spacer assembly comprises a plurality of projections that extend from the base between said pins into engagement with said second surface of the substrate structure.

22. A fixture as in claim 21, in which said projections comprise elongated tabs.

* * * * *